United States Patent [19]

Inoue et al.

[11] Patent Number: 5,061,906
[45] Date of Patent: Oct. 29, 1991

[54] VOLTAGE CONTROLLED OSCILLATOR USING CONTROL TRANSISTORS IN A LOOP FORMED OF INVERTERS

[75] Inventors: Shinichi Inoue, Sendai; Tatsuro Nakahara, Kagoshima, both of Japan

[73] Assignees: Fujitsu Limited, Kawasaki; Kyushu Fujitsu Electronics Limited, Satsuma, both of Japan

[21] Appl. No.: 557,052

[22] Filed: Jul. 25, 1990

[30] Foreign Application Priority Data

Jul. 28, 1989 [JP] Japan ................... 1-194373

[51] Int. Cl.$^5$ .............. H03K 3/03; H03K 3/354
[52] U.S. Cl. .................... 331/57; 331/2; 331/111; 331/177 R; 331/DIG. 3
[58] Field of Search .......... 331/2, 57, 111, DIG. 3, 331/177 R

[56] References Cited

U.S. PATENT DOCUMENTS 4,146,849  3/1979  Satou ................... 331/111

FOREIGN PATENT DOCUMENTS

| 57-61325 | 4/1982 | Japan . |
| 58-63223 | 4/1983 | Japan . |
| 59-131220 | 7/1984 | Japan . |
| 61-16614 | 1/1986 | Japan . |
| 62-20412 | 1/1987 | Japan . |
| 62-71319 | 4/1987 | Japan . |
| 62-294317 | 12/1987 | Japan . |

Primary Examiner—Siegfried H. Grimm
Attorney, Agent, or Firm—Armstrong, Nikaido, Marmelstein, Kubovcik, & Murray

[57] ABSTRACT

A first inverter logic element, a second inverter logic element, and a third inverter logic element constitute a loop circuit, and a first transistor, a second transistor, and a third transistor are connected between an output of the third inverter logic element and an input of the first inverter logic element. An output signal is taken out from an output of the second inverter logic element, and an oscillation frequency is regulated by the first transistor, the second transistor and the third transistor. Consequently, in a voltage controlled oscillator of the present invention, the number of loop circuits and transistors for regulating the oscillation frequency can be decreased, so that a simulation process can be simplified and required characteristics of the oscillation frequency can be easily obtained.

21 Claims, 5 Drawing Sheets

VOLTAGE CONTROLLED OSCILLATOR USING CONTROL TRANSISTORS IN A LOOP FORMED OF INVERTERS

BACKGROUND OF THE INVENTION

1. Field of the Invention

The present invention relates to a voltage controlled oscillator, more particuarly, to a voltage controlled oscillator for use in a phase locked loop circuit for generating a cock signal of a semiconductor device, and the like.

2. Description of the Related Art

In general, a voltage controlled oscillator (VCO circuit) comprises a plurality of inverters and transistors. In the VCO circuit, the inverters are connected as a loop, or constitute a loop circuit for generating an oscillation frequency, and the transistors are connected between the inverters and used to regulate characteristics of the oscillation frequency. Namely, the oscillation frequency of the VCO circuit is determined by the sizes of the transistors. Therefore, in a case where there are plural transistors for regulating the characteristics of the oscillation frequency or plural loops (loop circuits) of the VCO circuit, a simulation process for regulating the characteristics of the oscillation frequency becomes complex, so that required characteristics of the oscillation frequency cannot be easily attained. Additionally, as the number of logic circuits (inverter logic circuits) cannot be decreased, an occupancy area thereof becomes large.

It is an object of the present invention to provide a voltage controlled oscillator (VCO circuit) for decreasing the number of loop circuits thereof and simplifying a simulation process to obtain required characteristics of an oscillation frequency.

According to the present invention, there is provided a VCO circuit for controlling an oscillation frequency of an output signal in accordance with a voltage level of an input signal, wherein the VCO circuit comprises: a first inverter logic element, a second inverter logic element, and a third inverter logic element, for constituting a loop circuit thereamong; and a first transistor, a second transistor, and a third transistor, connected between an output of the third inverter logic element and an input of the first inverter logic element, the output signal being taken out from an output of the second inverter logic element, and the oscillation frequency being regulated by the first transistor, the second transistor and the third transistor.

The oscillation frequency of the output signal corresponding to a low voltage range of the input signal may be regulated by the first transistor, the oscillation frequency of the output signal corresponding to a high voltage range of the input signal may be regulated by the second transistor, and the oscillation frequency of the output signal corresponding to a middle voltage range of the input signal may be regulated by the third transistor. The first transistor may be constituted by a P-type MIS transistor, and the second transistor and the third transistor may be constituted by N-type MIS transistors.

The VCO circuit may further comprise a fourth transistor, the input signal may be directly supplied to the first transistor and the second transistor, and be supplied to the third transistor through the fourth transistor. The first transistor and the fourth transistor may be constituted by p-type MIS transistors, and the second transistor and the third transistor may be constituted by N-type MIS transistors.

The VCO circuit may further comprise a first capacitor and a second capacitor for determining the overall range of the oscillation frequency, the first capacitor may be connected between the loop circuit and a first power supply line, and the second capacitor may be connected between the loop circuit and a second power supply line. The first capacitor may connected between the output of the first inverter logic element and the first power supply line, and the second capacitor may be connected between the output of the first inverter logic element and the second power supply line.

The VCO circuit may further comprise a fifth transistor connected between the input of the first inverter logic element and the output of the second inverter logic element. The first transistor and the fifth transistor may be constituted by P-type MIS transistors, and the second transistor and the third transistor may be constituted by N-type MIS transistors.

The first inverter logic element, the second logic circuit and the third logic circuit may be determined as inverter circuits.

The first inverter logic element may be a two-input NAND gate circuit, one input of the first two-input NAND gate circuit may be supplied with an output signal of the third inverter logic element through the first, second and third transistors, and another input of the first two-input NAND gate circuit may be supplied with a control signal for stopping an oscillation operation thereof. The VCO circuit may be applied to a clock signal generator having a crystal oscillator unit, the clock signal generator selects between the output signal of the VCO circuit and an output signal of the crystal oscillator unit and output the clock signal based on the output signals therebetween, and when the output signal of the crystal oscillator unit is selected, the oscillation operation of the VCO circuit may be stopped by the control signal supplied to another input of the first two-input NAND gate circuit.

The second inverter logic element may also be a two-input NAND gate circuit, one input of the second two-input NAND gate circuit may be supplied with an output signal of the first inverter logic element, and another input of the second two-input NAND gate circuit may be supplied with a control signal for stopping an oscillation operation thereof. The VCO circuit may be applied to a clock signal generator having a crystal oscillator unit, the clock signal generator may select between the output signal of the VCO circuit and an output signal of the crystal oscillator unit and output a clock signal based on the output signals therebetween, and when the output signal of the crystal oscillator unit is selected, the oscillation operation of the VCO circuit may be stopped by the control signal supplied to another input of the second two-input NAND gate circuit According to the present invention, there is also provided a VCO circuit for controlling an oscillation frequency of an output signal by a voltage of an input signal, wherein the VCO circuit comprises: a first inverter logic element; a second inverter logic element connected to an output of the first logic circuit, and the output signal being taken out from an output of the second inverter logic element; a third inverter logic element, connected to an output of the second logic circuit, for constituting a loop circuit together with the first inverter logic element and the second inverter logic element; a first transistor having a control electrode and two other electrodes, for regulating the oscillation frequency of the output signal corresponding to a low voltage range of the input signal, the control electrode of the first transistor being supplied with the input voltage, and the two other electrodes of the first transistor being connected to an output of the third inverter logic element and an input of the first inverter logic element; a second transistor having a control electrode and two other electrodes, for regulating the oscillation frequency of the output signal corresponding to a high voltage range of the input signal, the control electrode of the second transistor being supplied with the input voltage, and the two other electrodes of the second transistor being connected to the output of the third inverter logic element and the input of the first inverter logic element; and a third transistor having a control electrode and two other electrodes, for regulating the oscillation frequency of the output signal corresponding to a middle voltage range of the input signal, the control electrode of the third transistor being operatively supplied with the input voltage, and the two other electrodes of the third transistor being connected to the output of the third inverter logic element and the input of the first inverter logic element.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

First, a voltage controlled oscillator according to the related art will be explained, with reference to FIG. 1.

Figure 1:
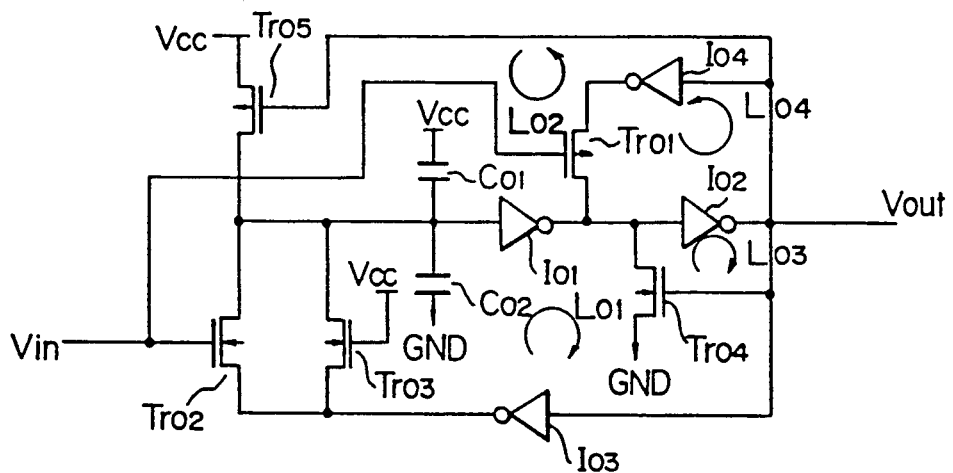
FIG. 1 is a circuit diagram illustrating an example of a voltage controlled oscillator according to the related art.

FIG. 1 is a circuit diagram illustrating an example of a voltage controlled oscillator according to the related art.

As shown in FIG. 1, the voltage controlled oscillator (VCO circuit) comprises four inverters $I_{01}$, $I_{02}$, $I_{03}$, $I_{04}$, five transistors $Tr_{01}$, $Tr_{02}$, $Tr_{03}$, $Tr_{04}$, $Tr_{05}$, and two capacitors $C_{01}$, $C_{02}$. Note, the inverters $I_{01}$, $I_{02}$, $I_{03}$ are connected as a loop, or constitute a loop circuit. The transistors $Tr_{02}$, $Tr_{03}$, which are N-type MIS transistors, are connected between an output of the inverter $I_{03}$ and an input of the inverter $I_{01}$. The input of the inverter $I_{01}$ is connected to one end of the capacitor $C_{01}$, one end of the capacitor $C_{02}$, and a drain of the transistor $Tr_{05}$. The other end of the capacitor $C_{01}$ is connected to a high potential power supply line Vcc, and the other end of the capacitor $C_{02}$ is connected to a low potential power supply line GND. The source of the transistor $Tr_{05}$ is connected to the high potential power supply line.

Furthermore, as shown in FIG. 1, an input of the inverter $I_{02}$ is connected to a drain of the P-type MIS transistor $Tr_{01}$ and a drain of the N-type MIS transistor $Tr_{04}$, and the output of the inverter $I_{02}$, where an output signal Vout is taken out, is connected to gates of the transistor $Tr_{04}$ and the transistor $Tr_{05}$, and an input of the inverter $I_{04}$. An output of the inverter $I_{04}$ is connected to a source of the transistor $Tr_{01}$. The input signal Vin is supplied to gates of the transistor $Tr_{01}$ and the transistor $Tr_{02}$.

Incidentally, as shown in FIG. 1, there are four loops $L_{01}$, $L_{02}$, $L_{03}$, $L_{04}$ in the VCO circuit of the related art. Namely, a first loop $L_{01}$ constituted by the inverters $I_{01}$, $I_{02}$, $I_{03}$ and the transistors $Tr_{02}$, $Tr_{03}$, a second loop $L_{02}$ constituted by the inverters $I_{01}$, $I_{02}$ and the transistor $Tr_{05}$, a third loop $L_{03}$ constituted by the inverter $I_{02}$ and the transistor $Tr_{04}$, and a fourth loop $L_{04}$ constituted by the inverters $I_{02}$, $I_{04}$ and the transistor $Tr_{01}$. Note, an oscillation frequency is determined by the capacitors $C_{01}$, $C_{02}$, and the transistors $Tr_{01}$, $Tr_{02}$, $Tr_{03}$, $Tr_{04}$, or the oscillation frequency in the VCO circuit is determined in accordance with capacitances of the capacitors $C_{01}$, $C_{02}$ and sizes of the four transistors $Tr_{01}$, $Tr_{02}$, $Tr_{03}$, $Tr_{04}$. Namely, the number of loops in the VCO circuit according to the related art is four, and the oscillation frequency thereof is determined by four transistors $Tr_{01}$, $Tr_{02}$, $Tr_{03}$, $Tr_{04}$, so that a simulation process for regulating characteristics of the oscillation frequency becomes complex. Therefore, required characteristics of the oscillation frequency cannot be easily obtained. Additionally, in the VCO circuit according to the related art, the number of logic circuits (inverter logic circuits) cannot be decreased.

Below, the preferred embodiments of a voltage controlled oscillator according to the present invention will be explained, with reference to the accompanying drawings.

Figure 2:
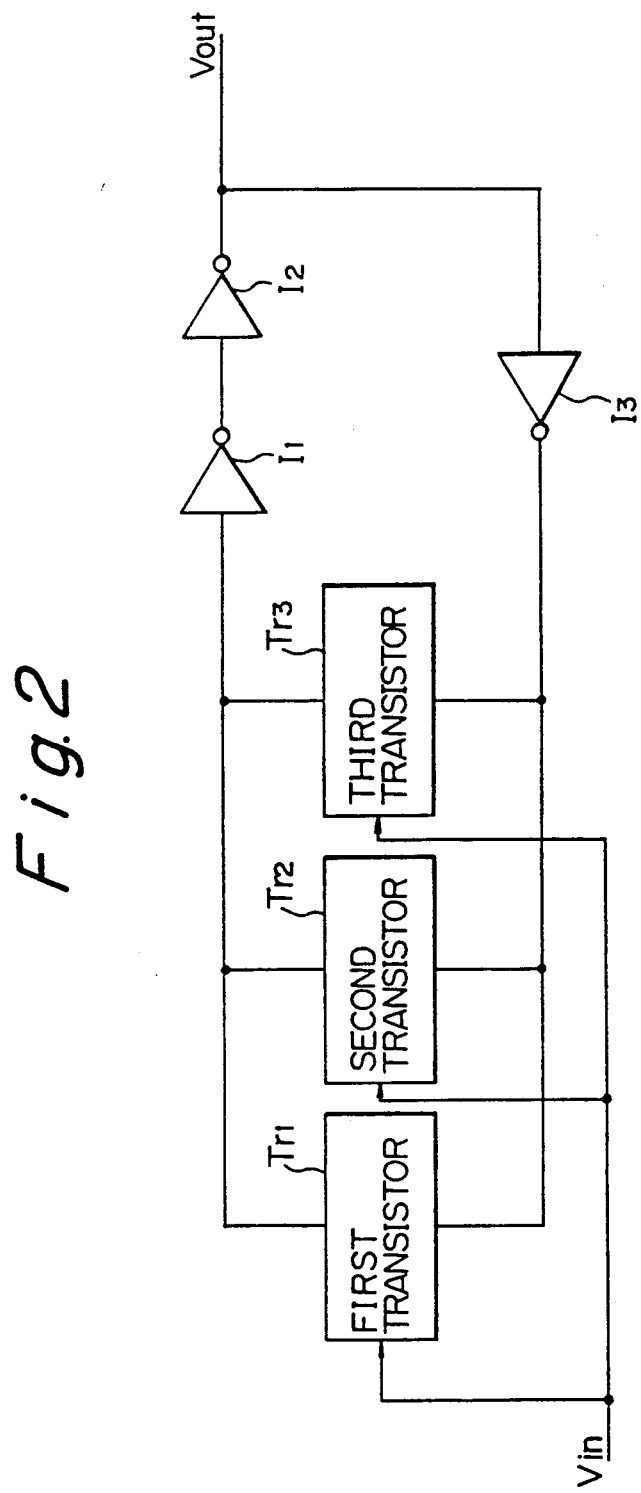
FIG. 2 is a block circuit diagram illustrating a principle of a voltage controlled oscillator according to the present invention.

FIG. 2 is a bock circuit diagram illustrating a principle of a voltage controlled oscillator according to the present invention.

As shown in FIG. 2, the voltage controlled oscillator, which is used to control an oscillation frequency of an output signal Vout by a voltage level of an input signal Vin, comprises a first inverter $I_1$, a second inverter $I_2$, and a third inverter $I_3$ connected as a loop, and a first transistor $Tr_1$, a second transistor $Tr_2$, and a third transistor $Tr_3$ arranged between an output of the third inverter $I_3$ and an input of the first inverter $I_1$ in parallel. Note, the output signal Vout is taken out from an output of the second inverter $I_2$, and the input signal Vin is supplied to the first, second and third transistors $Tr_1$, $Tr_2$, $Tr_3$. These transistors $Tr_1$, $Tr_2$, $Tr_3$ regulate an oscillation frequency of the output signal Vout in accordance with the voltage level of the input signal Vin.

For example, the first transistor $Tr_1$ regulates the oscillation frequency of the output signal Vout corresponding to a low voltage range of the input signal Vin, the second transistor $Tr_2$ regulates the oscillation frequency of the output signal Vout corresponding to a high voltage range of the input signal Vin, and the third transistor $Tr_3$ regulates the oscillation frequency of the output signal Vout corresponding to a middle voltage range of the input signal Vin.

Consequently, in a voltage controlled oscillator of the present invention, the number of transistors for regulating an oscillation frequency can be decreased and the number of loop circuits can be decreased, and thus a simulation process can be simplified and required characteristics of an oscillation frequency can be easily obtained.

Figure 3:
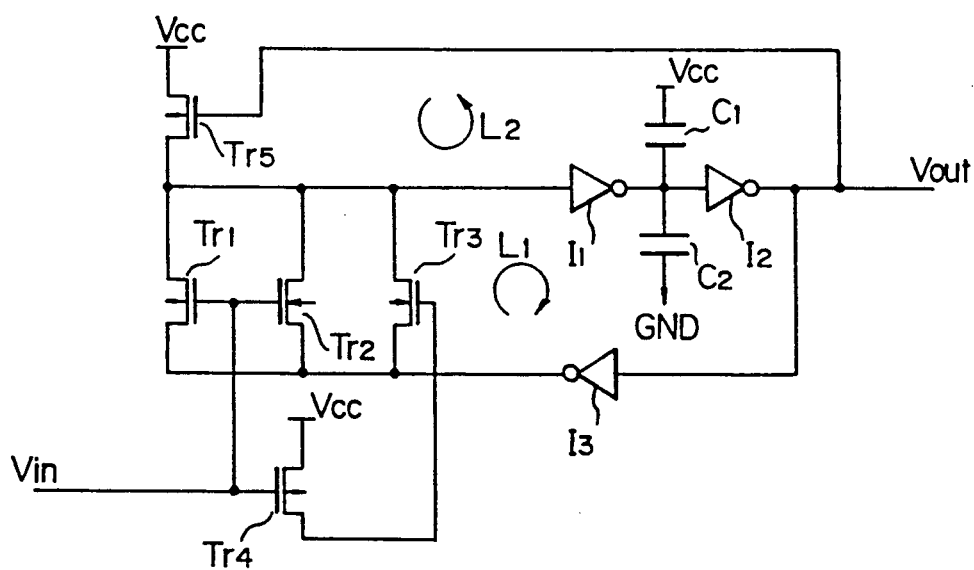
FIG. 3 is a circuit diagram illustrating an embodiment of a voltage controlled oscillator according to the present invention.

FIG. 3 is a circuit diagram illustrating an embodiment of a voltage controlled oscillator according to the present invention. In FIG. 3, the voltage controlled oscillator (VCO circuit), which is used to control an oscillation frequency of an output signal Vout by a voltage of an input signal Vin, comprises three inverters $I_1$, $I_2$, $I_3$, five transistors $Tr_1$, $Tr_2$, $Tr_3$, $Tr_4$, $Tr_5$, and two capacitors $C_1$, $C_2$. The inverters $I_1$, $I_2$, $I_3$ are connected as a loop, or constitute a loop circuit.

The P-type MIS transistor $Tr_1$ and the N-type MIS transistors $Tr_2$, $Tr_3$ are connected between an output of the inverter $I_3$ and an input of the inverter $I_1$. An input of the inverter $I_1$ is connected to a drain of the P-type MIS transistor $Tr_5$, and a source of the transistor $Tr_5$ is connected to a power supply (high potential power supply line) Vcc. Note, the output signal Vout is taken out from an output of the inverter $I_2$, and the input signal Vin is supplied to gates of the transistors $Tr_1$, $Tr_2$, $Tr_4$. The transistor $Tr_4$ is a P-type MIS transistor, a source thereof is connected to the power supply Vcc, and a drain thereof is connected to a gate of the transistor $Tr_3$. One end of the capacitor $C_1$ is connected to the power supply Vcc, and the other end of the capacitor $C_1$ is connected to an input of the inverter $I_2$. One end of the capacitor $C_2$ is connected to a ground (low potential power supply line) GND, and the other end of the capacitor $C_2$ is connected to the input of the inverter $I_2$.

Incidentally, as shown in FIG. 3, there are two loops $L_1$, $L_2$ in the VCO circuit of the present embodiment. Namely, a first loop $L_1$ is constituted by the inverters $I_1$, $I_2$, $I_3$ and the transistors $Tr_1$, $Tr_2$, $Tr_3$, and a second loop $L_2$ is constituted by the inverters $I_1$, $I_2$ and the transistor $Tr_5$. Note, the overall characteristics (outline characteristics) of the oscillation frequency of the output signal Vout are determined in accordance with capacitances of the capacitors $C_1$, $C_2$, and characteristics (partial characteristics) of the oscillation frequency of the output signal Vout corresponding to voltage ranges of the input signal Vin are regulated in accordance with sizes of the transistors $Tr_1$, $Tr_2$, $Tr_3$. Note, the number of loops in the VCO circuit according to the present embodiment is two, and the oscillation frequency (partial characteristics) thereof is determined by three transistors $Tr_1$, $Tr_2$, $Tr_3$.

When, comparing the VCO circuit of the present embodiment shown in FIG. 3 with that of the related art shown in FIG. 1, the number of loops in the VCO circuit of the present embodiment is fewer by two than that of the related art, and the number of transistors for regulating the characteristics of the oscillation frequency is fewer by one than that of the related art.

Furthermore, the number of inverter circuits of the present embodiment is fewer by one than that of the related art. Consequently, in the VCO circuit of the present invention, the number of loop circuits and transistors for regulating the characteristics of the oscillation frequency can be decreased, and thus a simulation process can be simplified and required characteristics of an oscillation frequency can be easily obtained. Additionally, in the VCO circuit according to the present embodiment, the number of logic circuits (inverter circuits) can be decreased.

Figure 4:
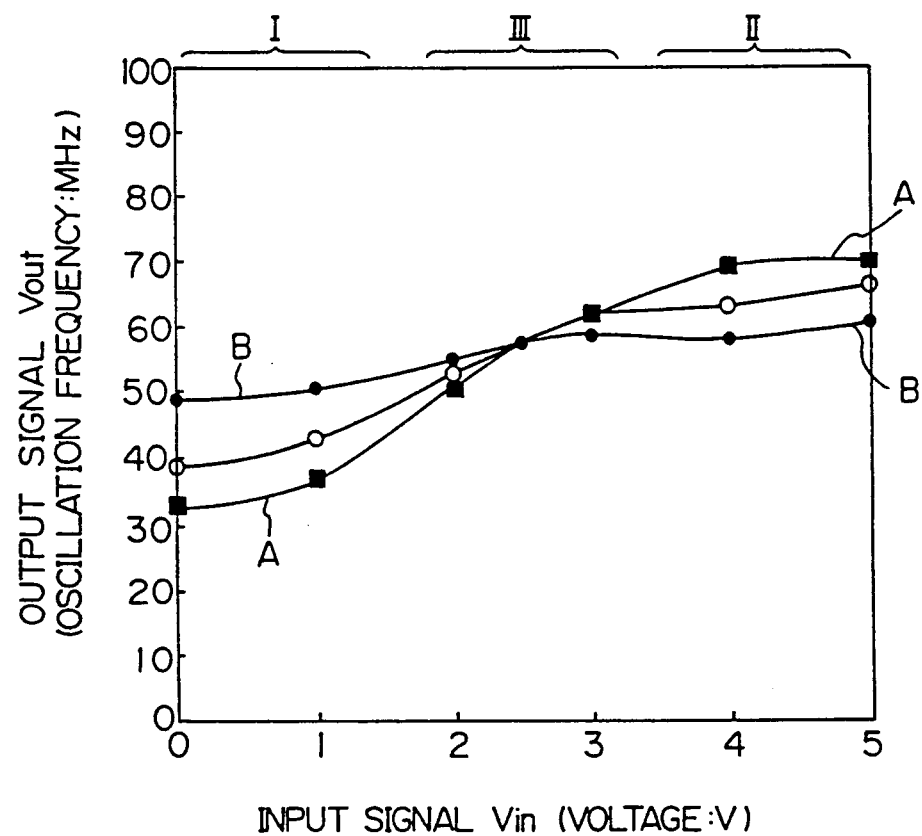
FIG. 4 is a diagram illustrating operation characteristics of a simulation result in the voltage controlled oscillator shown in FIG. 3.

FIG. 4 is a diagram illustrating operation characteristics of a simulation result in the voltage controlled oscillator shown in FIG. 3. As shown in FIG. 4, in a low voltage range I of the input signal Vin, the oscillation frequency of the output signal Vout is regulated by an on-resistance of the P-type MIS transistor $Tr_1$; in a high voltage range II of the input signal Vin, the oscillation frequency of the output signal Vout is regulated by an on-resistance of the N-type MIS transistor $Tr_2$; and in a middle voltage range III of the input signal Vin, the oscillation frequency of the output signal Vout is regulated by an on-resistance of the N-type MIS transistor $Tr_3$.

Below, the characteristics between the oscillation frequency of the output signal Vout and the voltage value of the input signal Vin will be explained in detail. The resistance values of the transistors $Tr_1$ to $Tr_4$ are indicated for different voltage values of the input signal Vin. Namely, when a voltage value of the input signal Vin is at 0 volts, which corresponds to the low voltage range I in FIG. 4, the resistance values of the transistors $Tr_1$, $Tr_2$, $Tr_3$, $Tr_4$ are indicated by $R_{1-0}$, $R_{2-0}$, $R_{3-0}$, $R_{4-0}$; when a voltage value of the input signal Vin is at 2 volts, which corresponds to the middle voltage range III in FIG. 4, the resistance values of the transistors $Tr_1$, $Tr_2$, $Tr_3$, $Tr_4$ are indicated by $R_{1-2}$, $R_{2-2}$, $R_{3-2}$, $R_{4-2}$; and when a voltage value of the input signal Vin is at 5 volts, which corresponds to the high voltage range II in FIG. 4, the resistance values of the transistors $Tr_1$, $Tr_2$, $Tr_3$, $Tr_4$ are indicated by $R_{1-5}$, $R_{2-5}$, $R_{3-5}$, $R_{4-5}$. Furthermore, combined resistances of the transistors $Tr_1$, $Tr_2$, $Tr_3$ in the above three cases, or a resistance value between the output of the inverter $I_3$ and the input of the inverter $I_1$, is indicated by $R_0$ (when a voltage value of the input signal Vin is at 0 volts), $R_2$ (when a voltage value of the input signal Vin is at 2 volts), and $R_5$ (when a voltage value of the input signal Vin is at 5 volts).

First, in the low voltage range I of the input signal Vin, or when the voltage value of the input signal Vin is at 0 volts, the transistors $Tr_1$, $Tr_3$, $Tr_4$ are switched ON, and the transistor $Tr_2$ only is switched OFF. Therefore, the combined resistance $R_0$ is determined by the on-resistances $R_{1-0}$, $R_{3-0}$, and indicated by the following equation (1).

$$R_0 = (R_{1-0} \cdot R_{3-0})/(R_{1-0} + R_{3-0}) \ldots \qquad (1)$$

Next, in the middle voltage range III of the input signal Vin, or when the voltage value of the input signal Vin is at 2 volts, all of the transistors $Tr_1$, $Tr_2$, $Tr_3$, $Tr_4$ are switched ON. Note, the transistors $Tr_1$, $Tr_2$, $Tr_3$, $Tr_4$ are not completely switched ON, and thus on-resistances $R_{1-2}$, $R_{2-2}$, $R_{3-2}$, $R_{4-2}$ of transistors $Tr_1$, $Tr_2$, $Tr_3$, $Tr_4$ are larger than that of the completely switching ON state. Therefore, the combined resistance $R_2$ is determined by the on-resistances $R_{1-2}$, $R_{2-2}$, $R_{3-2}$, and indicated by the following equation (2).

$$R_2 = (R_{1-2} \cdot R_{2-2} \cdot R_{3-2})/(R_{1-2} \cdot R_{2-2} + R_{2-2} \cdot R_{3-2} + R_{3-2} \cdot R_{1-2}) \ldots \qquad (2)$$

Next, in the high voltage range II of the input signal Vin, or when the voltage value of the input signal Vin is at 5 volts, the transistor $Tr_2$ only is switched ON, and the transistors $Tr_1$, $Tr_3$, $Tr_4$ are switched OFF. Therefore, the combined resistance $R_5$ is determined by the on-resistance $R_{2-5}$, and indicated by the following equation (3).

$$R_5 = R_{2-5}. \quad\quad (3)$$

In the above descriptions, the relation of values of the on-resistances are as follows:

$$R_{1-0} < R_{1-2} < R_{1-5}(=\infty)$$

$$R_{2-0}(=\infty) > R_{2-2} > R_{2-5}$$

$$R_{3-0} < R_{3-2} < R_{3-5}(=\infty)$$

These differences in the on-resistances (for example, $R_{1-0}$, $R_{1-2}$, $R_{1-5}$) of the same transistor (for example, $Tr_1$) are caused by the fact that an on-resistance of each transistor depends on a voltage value $V_{GS}$ (a voltage value between a gate and a source of the transistor). In FIG. 4, all characteristic curves (curve A, B, and the like) are obtained when resistance values of the combined resistances $R_0$, $R_2$, $R_5$ are defined as $R_0 < R_2 < R_5$.

Note, as described above, the overall characteristics (outline characteristics) of the oscillation frequency of the output signal Vout are determined in accordance with capacitances of the capacitors $C_1$, $C_2$.

As described above, in the VCO circuit according to the present invention, the overall characteristics (outline characteristics) of the oscillation frequency of the output signal Vout (a main control of the oscillation frequency of the output signal Vout) are determined in accordance with capacitances of the capacitors $C_1$, $C_2$, and partial characteristics of the oscillation frequency of the output signal Vout (the oscillation frequency of the output signal Vout corresponding to the low, high and middle voltage ranges of the input signal Vin) are regulated in accordance with sizes of the transistors $Tr_1$, $Tr_2$, $Tr_3$. When a VCO circuit having wide frequency characteristics is required (which corresponds to a curve A in FIG. 4), the transistors $Tr_1$, $Tr_2$ are formed in such a way that each on-resistance of the transistors $Tr_1$, $Tr_2$ is decreased, that is, a gate length of each transistor $Tr_1$, $Tr_2$ is shortened or a gate width of each transistor $Tr_1$, $Tr_2$ is enlarged.

Conversely, when a VCO circuit having narrow frequency characteristics is required (which corresponds to a curve B in FIG. 4), the transistors $Tr_1$, $Tr_2$ are formed in such a way that each on-resistance of the transistors $Tr_1$, $Tr_2$ is increased, that is, a gate length of each transistor $Tr_1$, $Tr_2$ is lengthened or a gate width of each transistor $Tr_1$, $Tr_2$ is reduced.

Incidentally, although the transistor $Tr_3$ determines the oscillation frequency of the output signal Vout in the middle voltage range of the input signal Vin, in the VCO circuit, the oscillation frequency is generally instituted to a target frequency value of the case when $V_{in} = Vcc/2$, and consequently, the on-resistance of the transistor $Tr_3$ is utilized for regulating the target frequency value of the case when $V_{in} = Vcc/2$. Note, when the time of $V_{in} = Vcc/2$, the overall on-resistance is determined by on-resistances of the transistors $Tr_1$, $Tr_2$, $Tr_3$ which are connected between the output of the third inverter $I_3$ and the input of the first inverter $I_1$ in parallel.

Figure 5:
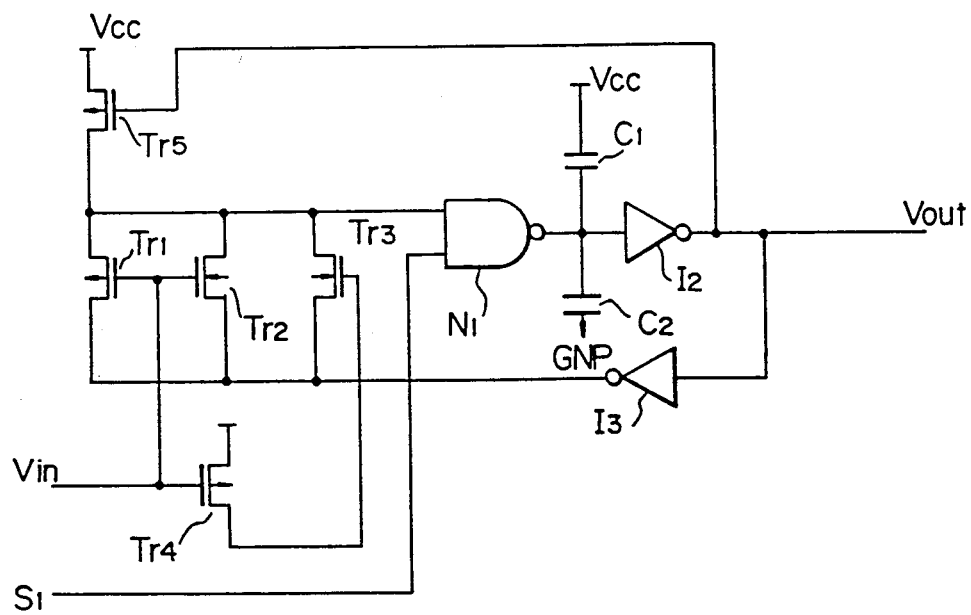
FIG. 5 is a circuit diagram illustrating a first modification of the voltage controlled oscillator shown in FIG. 3.
Figure 6:
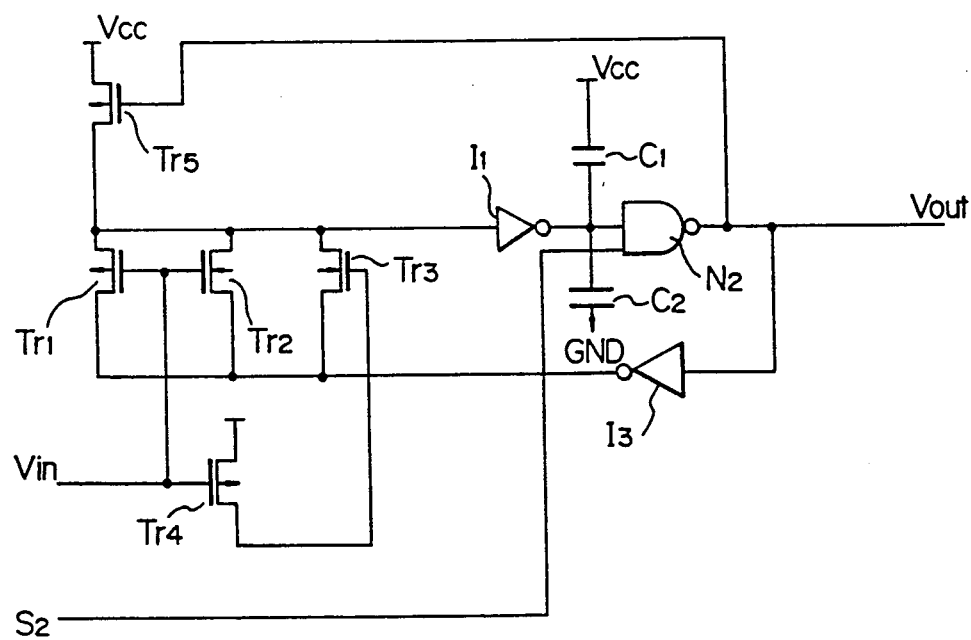
FIG. 6 is a circuit diagram illustrating a second modification of the voltage controlled oscillator shown in FIG. 3.

FIG. 5 is a circuit diagram illustrating a first modification of the voltage controlled oscillator shown in FIG. 3, and FIG. 6 is a circuit diagram illustrating a second modification of the voltage controlled oscillator shown in FIG. 3.

As shown in FIG. 5, in the first modification of the voltage controlled oscillator (VCO circuit), the inverter $I_1$ of the VCO circuit shown in FIG. 3 is modified to a two-input NAND gate circuit $N_1$. One input of the two-input NAND gate circuit $N_1$ is connected to the transistors $Tr_1$, $Tr_2$, $Tr_3$, $Tr_4$ the same as the input of the inverter $I_1$ shown in FIG. 3, and the other input of the two-input NAND gate circuit $N_1$ is supplied with a control signal for stopping an oscillation operation of the VCO circuit. Namely, when the control signal is at a low level, the oscillation operation of the VCO circuit is stopped, and the output signal Vout of the VCO circuit is maintained at a low level.

Similarly, as shown in FIG. 6, in the second modification of the VCO circuit, the inverter $I_2$ of the VCO circuit shown in FIG. 3 is modified to a two-input NAND gate circuit $N_2$. One input of the two-input NAND gate circuit $N_2$ is connected to output of inverter I, the same as the input of the inverter $I_2$ shown in FIG. 3, and the other input of the two-input NAND gate circuit $N_2$ is supplied with a control signal for stopping an oscillation operation of the VCO circuit.

Namely, when the control signal is at a low level, the oscillation operation of the VCO circuit is stopped, and the output signal Vout of the VCO circuit is maintained at a low level.

Figure 7:
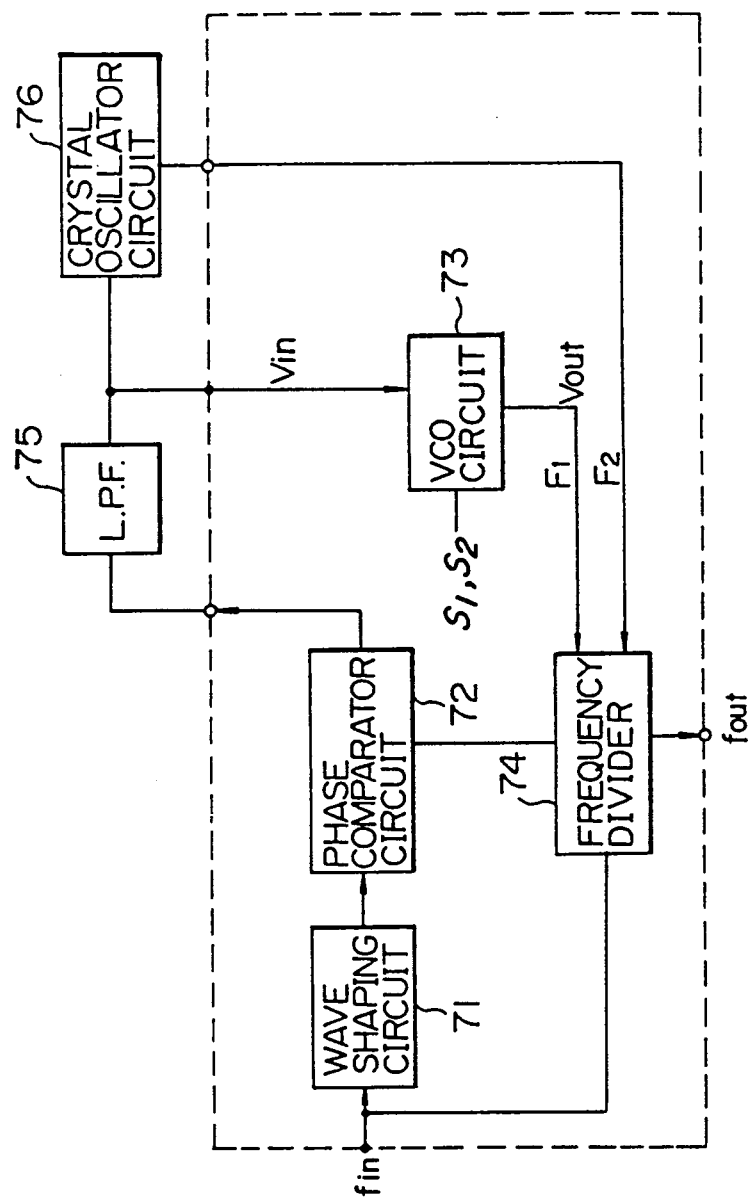
FIG. 7 is a block diagram illustrating an example of a clock signal generation circuit using a voltage controlled oscillator shown in FIGS. 5 or 6.

FIG. 7 is a block diagram illustrating an example of a clock signal generation circuit using a voltage controlled oscillator shown in FIGS. 5 or 6.

As shown in FIG. 7, the cock signal generation circuit comprises a wave shaping circuit 71, a phase comparator circuit 72, a voltage controlled oscillator (VCO circuit) 73, a frequency divider 74, a low pass filter (L.P.F.) 75, and a crystal oscillator circuit 76. This clock signal generation circuit is a phase locked loop circuit, and it includes two modes of clock signal generation. Note, the low pass filter 75 and the crystal oscillator circuit 76 are attached externally to a chip (PLL chip). Furthermore, one mode of the clock signal is generated by a circuit including the wave shaping circuit 71, the phase comparator circuit 72, the VCO circuit 73, the frequency divider 74, and the low pass filter 75, and the other mode of the clock signal is generated by a circuit including the wave shaping circuit 71, the phase comparator circuit 72, the crystal oscillator circuit 76, the frequency divider 74, and the low pass filter 75. Namely, an output signal Vout ($F_1$) of the VCO circuit 73 and an output signal ($F_2$) of the crystal oscillator circuit 76 are supplied to the frequency divider 74, and one output signal thereof is selected by the frequency divider and used in the frequency divider 74.

This clock signal generation circuit is, for example, used for a television set or a stationary type video tape recorder. Namely, when receiving a television broadcast, a frequency lock process using a burst signal (which is a high frequency of 3.58 MHz) is generally required, in this case, the output signal $F_2$ of the crystal oscillator circuit 76 is selected and the clock signal generation circuit outputs clock signals of 4·fsc and 8·fsc (fsc denotes a color subcarrier frequency), as these clock signals of 4·fsc and 8·fsc require high accuracy and the output signal $F_2$ of the crystal oscillator circuit 76 is accurate. In this case, as described above with reference to FIGS. 5, 6, the control signal supplied to the other input of the two-input NAND gate circuit $N_1$ or $N_2$ is maintained at a low level for stopping the oscillation operation of the VCO circuit 73. Nevertheless, in the stationary type video tape recorder a frequency lock process is generally carried out by using a horizontal synchronizing signal (which is a low frequency of 15.7 KHz), in this case, the output signal of the $F_1$ circuit 73 is selected. The clock signal generation circuit including the VCO circuit 73 and the crystal oscillator circuit 76 shown in FIG. 7 can be used for various devices.

In the above descriptions, in the clock signal generation circuit including the VCO circuit and the crystal oscillator circuit, when selecting the crystal oscillator circuit, the control signal is changed to a low level, the oscillation operation of the VCO circuit is stopped and a dynamic current does not flow in the VCO circuit, so that power consumption of the clock signal generation circuit can be decreased.

As described above, in the voltage controlled oscillator according to the present invention, the number of the main control elements (transistors for regulating an oscillation frequency) can be decreased, and further, the number of loop circuits in the voltage controlled oscillator can be also decreased, so that a simulation process can be simplified and required characteristics of an oscillation frequency can be easily obtained. Additionally, in the voltage controlled oscillator according to the present embodiment, the number of logic circuits (inverter circuits) can be decreased.

Many widely differing embodiments of the present invention may be constructed without departing from the spirit and scope of the present invention, and it should be understood that the present invention is not limited to the specific embodiments described in this specification, except as defined in the appended claims.

We claim:

1. A voltage controlled oscillator for controlling an oscillation frequency of an output signal in accordance with a voltage level of an input signal, wherein said voltage controlled oscillator comprises:
    a first inverter logic element, a second inverter logic element, and a third inverter logic element connected in series, for constituting a loop circuit thereamong; and
    a first transistor, a second transistor, and a third transistor, parallely connected between an output of said third inverter logic element and an input of said first inverter logic element, said input signal being input to said transistors, said output signal being taken out from an output of said second inverter logic element, and said oscillation frequency being regulated by said first transistor, said second transistor and said third transistor.

2. A voltage controlled oscillator as claimed in claim 1, wherein the oscillation frequency of said output signal corresponding to a low voltage range of said input signal is regulated by said first transistor, the oscillation frequency of said output signal corresponding to a high voltage range of said input signal is regulated by said second transistor, and the oscillation frequency of said output signal corresponding to a middle voltage range of said input signal is regulated by said third transistor.

3. A voltage controlled oscillator as claimed in claim 2, wherein said first transistor is constituted by a P-type MIS transistor, and said second transistor and said third transistor are constituted by N-type MIS transistors.

4. A voltage controlled oscillator as claimed in claim 1, wherein said voltage controlled oscillator further comprises a fourth transistor, said input signal is directly supplied to said first transistor and said second transistor, and is supplied to said third transistor through said fourth transistor.

5. A voltage controlled oscillator as claimed in claim 4, wherein said first transistor and said fourth transistor are constituted by P-type MIS transistors, and said second transistor and said third transistor are constituted by N-type MIS transistors.

6. A voltage controlled oscillator as claimed in claim 1, wherein said voltage controlled oscillator further comprises a first capacitor and a second capacitor for determining the overall range of said oscillation frequency, said first capacitor is connected between an output of said first inverter logic element in said loop circuit and a first power supply line, and said second capacitor is connected between said output of said first inverter logic element in said loop circuit and a second power supply line.

7. A voltage controlled oscillator as claimed in claim 1, wherein said voltage controlled oscillator further comprises a fifth transistor connected between the input of said first inverter logic element and the output of said second inverter logic element.

8. A voltage controlled oscillator as claimed in claim 7, wherein said first transistor and said fifth transistor are constituted by P-type MIS transistors, and said second transistor and said third transistor are constituted by N-type MIS transistors.

9. A voltage controlled oscillator as claimed in claim 1, wherein said first inverter logic element, said second logic circuit and said third logic circuit are inverter circuits.

10. A voltage controlled oscillator as claimed in claim 1, wherein said first inverter logic element is a two-input NAND gate circuit, one input of said first two-input NAND gate circuit is supplied with an output signal of said third inverter logic element through said first, second and third transistors, and the other input of said first two-input NAND gate circuit is supplied with a control signal for stopping an oscillation operation thereof.

11. A voltage controlled oscillator as claimed in claim 1, wherein said second inverter logic element is a two-input NAND gate circuit, one input of said second two-input NAND gate circuit is supplied with an output signal of said first inverter logic element, and the other input of said second two-input NAND gate circuit is supplied with a control signal for stopping an oscillation operation thereof.

12. A voltage controlled oscillator for controlling an oscillation frequency of an output signal by a voltage of an input signal, wherein said voltage controlled oscillator comprises:
    a first inverter logic element;
    a second inverter logic element connected to an output of said first inverter logic element, and said output signal being taken out from an output of said second inverter logic element;
    a third inverter logic element, connected to an output of said second inverter logic element, for constituting a loop circuit together with said first inverter logic element and said second inverter logic element;
    a first transistor having a control electrode and two other electrodes, for regulating the oscillation frequency of said output signal corresponding to a low voltage range of said input signal, said control electrode of said first transistor being supplied with said input signal, and said two other electrodes of said first transistor being connected to an output of said third inverter logic element and an input of said first inverter logic element;

a second transistor having a control electrode and two other electrodes, for regulating the oscillation frequency of said output signal corresponding to a high voltage range of said input signal, said control electrode of said second transistor being supplied with said input signal, and said two other electrodes of said second transistor being connected to the output of said third inverter logic element and the input of said first inverter logic element; and a third transistor having a control electrode and two other electrodes, for regulating the oscillation frequency of said output signal corresponding to a middle voltage range of said input signal, said control electrode of said third transistor being operatively supplied with said input signal, and said two other electrodes of said third transistor being connected to the output of said third inverter logic element and the input of said first inverter logic element.

13. A voltage controlled oscillator as claimed in claim 12, wherein said first transistor is constituted by a P-type MIS transistor, and said second transistor and said third transistor are constituted by N-type MIS transistors.

14. A voltage controlled oscillator as claimed in claim 12, wherein said voltage controlled oscillator further comprises a fourth transistor having a control electrode and two other electrodes, said control electrode of said fourth transistor is supplied with said input signal, one of said two other electrodes of said fourth transistor is connected to a first power supply line, and the other of said two other electrodes of said fourth transistor is connected to the control electrode of said third transistor.

15. A voltage controlled oscillator as claimed in claim 14, wherein said first transistor and said fourth transistor are constituted by P-type MIS transistors, and said second transistor and said third transistor are constituted by N-type MIS transistors.

16. A voltage controlled oscillator as claimed in claim 12, wherein said voltage controlled oscillator further comprises a first capacitor and a second capacitor for determining overall range of said oscillation frequency, said first capacitor is connected between the output of said first inverter logic element in said loop circuit and a first power supply line, and said second capacitor is connected between the output of said first inverter logic element in said loop circuit and a second power supply line.

17. A voltage controlled oscillator as claimed in claim 12, wherein said voltage controlled oscillator further comprises a fifth transistor having a control electrode and two other electrodes, said control electrode of said fifth transistor is supplied with said output signal, one of said two other electrodes of said fifth transistor is connected to a first power supply line, and the other of said two other electrodes of said fifth transistor is connected to the input of said first inverter logic element.

18. A voltage controlled oscillator as claimed in claim 17, wherein said first transistor and said fifth transistor are constituted by P-type MIS transistors, and said second transistor and said third transistor are constituted by N-type MIS transistors.

19. A voltage controlled oscillator as claimed in claim 12, wherein said first inverter logic element, said second inverter logic element and said third inverter logic element are inverter circuits.

20. A voltage controlled oscillator as claimed in claim 12, wherein said first inverter logic element is a two-input NAND gate circuit, one input of said first two-input NAND gate circuit is connected to ones of two other electrodes of said first, second and third transistors, and the other input of said first two-input NAND gate circuit is supplied with a control signal for stopping an oscillation operation thereof.

21. A voltage controlled oscillator as claimed in claim 12, wherein said second inverter logic element is a two-input NAND gate circuit, one input of said second two-input NAND gate circuit is connected to the output of said first inverter logic element, and the other input of said second two-input NAND gate circuit is supplied with a control signal for stopping an oscillation operation thereof.

* * * * *